United States Patent
Shimizu et al.

(10) Patent No.: US 8,755,422 B2
(45) Date of Patent: Jun. 17, 2014

(54) SURFACE EMITTING LASER, LIGHT SOURCE, AND OPTICAL MODULE

(75) Inventors: Hitoshi Shimizu, Tokyo (JP); Yasumasa Kawakita, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 326 days.

(21) Appl. No.: 13/187,838

(22) Filed: Jul. 21, 2011

(65) Prior Publication Data

US 2012/0020383 A1    Jan. 26, 2012

(30) Foreign Application Priority Data

Jul. 22, 2010   (JP) ................................. 2010-165302

(51) Int. Cl.
*H01S 5/183*    (2006.01)
(52) U.S. Cl.
USPC ............... 372/50.124; 372/45.01; 372/46.013
(58) Field of Classification Search
USPC ..................................................... 372/50.124
See application file for complete search history.

(56) References Cited

U.S. PATENT DOCUMENTS

| | | | |
|---|---|---|---|
| 5,002,403 A | | 3/1991 | Hirose et al. |
| 5,568,499 A | * | 10/1996 | Lear ............................ 372/45.01 |
| 8,494,022 B2 | * | 7/2013 | Shimizu et al. .......... 372/50.124 |
| 2002/0131462 A1 | | 9/2002 | Lin et al. |
| 2006/0285566 A1 | | 12/2006 | Ueki |
| 2007/0036189 A1 | * | 2/2007 | Hori et al. ................... 372/50.11 |
| 2008/0043796 A1 | | 2/2008 | Jikutani et al. |
| 2008/0212633 A1 | * | 9/2008 | Shimizu et al. .......... 372/45.011 |
| 2010/0008674 A1 | | 1/2010 | Shimizu et al. |
| 2010/0189467 A1 | | 7/2010 | Sato et al. |

FOREIGN PATENT DOCUMENTS

| | | |
|---|---|---|
| JP | 63-188986 | 8/1988 |
| JP | 6-029611 A | 2/1994 |
| JP | 06-268323 | 9/1994 |
| JP | 11-354881 A | 12/1999 |
| JP | 2002-299742 A | 10/2002 |
| JP | 2002-359433 A | 12/2002 |
| JP | 2004-063634 A | 2/2004 |
| JP | 2005-044964 A | 2/2005 |
| JP | 2005-093634 A | 4/2005 |
| JP | 2006-310534 A | 11/2006 |
| JP | 2006-351798 A | 12/2006 |

(Continued)

OTHER PUBLICATIONS

Office Action mailed May 21, 2013 for corresponding Japanese application No. 2011-160086.

(Continued)

*Primary Examiner* — Xinning Niu
(74) *Attorney, Agent, or Firm* — Lowe Hauptman & Ham, LLP

(57) ABSTRACT

A surface emitting laser includes lower and upper multilayer mirrors, first-conductivity-type and second-conductivity-type contact layers formed between the lower and the upper multilayer mirrors, an active layer formed between the first-conductivity-type and the second-conductivity-type contact layers, a current confinement layer formed between the second-conductivity-type contact layer and the active layer, and first and second composition gradient layers formed facing each other across the current confinement layer. The first composition gradient layer and the second composition gradient layer are formed such that bandgap energy of each of the layers is monotonically decreased from the current confinement layer to an adjacent layer and approach bandgap energy of the adjacent layer in a growth direction.

14 Claims, 8 Drawing Sheets

(56) References Cited

FOREIGN PATENT DOCUMENTS

| | | |
|---|---|---|
| JP | 2008-244470 A | 10/2008 |
| JP | 2010-010646 A | 1/2010 |
| WO | 2009064018 A1 | 5/2009 |

OTHER PUBLICATIONS

Office Action corresponding to JP2011-160086, dated Jan. 8, 2013.

N. Suzuki, et al., "25-Gbps operation of 1.1-μm-range InGaAs VCSELs for high-speed optical interconnections," OFA4, OFC2006.

* cited by examiner

SURFACE EMITTING LASER, LIGHT SOURCE, AND OPTICAL MODULE

CROSS-REFERENCE TO RELATED APPLICATION

This application is based upon and claims the benefit of priority from the prior Japanese Patent Application No. 2010-165302, filed on Jul. 22, 2010; the entire contents of which are incorporated herein by reference.

BACKGROUND OF THE INVENTION

1. Field of the Invention

The present invention relates to a surface emitting laser, a light source, and an optical module.

2. Description of the Related Art

Surface emitting lasers that emit laser light at a wavelength in 850-nm band have been mainly used as light sources for optical interconnection. An integrated circuit (IC) driver normally drives the surface emitting laser of 850-nm band at 3.3 volts, with respect to the energy bandgap of a GaAs-based quantum well of an active layer of the surface emitting laser of this type.

However, not only the surface emitting lasers for optical interconnection, but all the surface emitting lasers are desired to reduce power consumption in the market. To reduce power consumption in such surface emitting lasers, a method of using a surface emitting laser having an oscillation wavelength longer than 850 nm, in which the energy bandgap of the active layer is lowered, and that can further reduce the bias voltage has been studied. By using a strained InGaAs quantum well for the active layer in order to increase the oscillation wavelength, a differential gain is increased and the power consumption can be further reduced.

Conventional surface emitting lasers having a wavelength longer than 850 nm have a structure disclosed in, for example, N. Suzuki, et al., "25-Gbps operation of 1.1-μm-range InGaAs VCSELs for high-speed optical interconnections", OFA4, OFC2006. The surface emitting laser includes a selectively-oxidized current confinement layer. In the surface emitting laser, distributed Bragg reflector (DBR) mirrors that are multilayer reflection mirrors formed of a periodic structure of a high refractive index layer and a low refractive index layer are used as an optical resonator, and a p-side electrode is formed above the upper DBR mirror.

However, there is a problem that, when a bias current equal to or larger than a threshold current is applied to a surface emitting laser having a conventional structure, power consumption of the surface emitting laser increases.

SUMMARY OF THE INVENTION

It is an object of the present invention to at least partially solve the problems in the conventional technology.

According to one aspect of the present invention, there is provided a surface emitting laser including a substrate, a lower multilayer mirror and an upper multilayer mirror of a periodic structure of a high refractive index layer and a low refractive index layer formed on the substrate, a first-conductivity-type contact layer and a second-conductivity-type contact layer formed between the lower multilayer mirror and the upper multilayer mirror, an active layer formed between the first-conductivity-type contact layer and the second-conductivity-type contact layer, a current confinement layer formed between the second-conductivity-type contact layer and the active layer and including a current injection portion and a current confinement portion surrounding the current injection portion, a first composition gradient layer and a second composition gradient layer formed facing each other across the current confinement layer, the first composition gradient layer being arranged on the second-conductivity-type contact layer side and the second composition gradient layer being arranged on the active layer side, a first-conductivity-type side electrode formed on the first-conductivity-type contact layer, and a second-conductivity-type side electrode formed on the second-conductivity-type contact layer. The first composition gradient layer and the second composition gradient layer are formed such that bandgap energy of each of the layers is monotonically decreased from the current confinement layer to an adjacent layer and approach bandgap energy of the adjacent layer in a growth direction. The second-conductivity-type cladding layer includes material for reducing mobility of carrier. Carrier concentration of the second composition gradient layer is equal to or more than carrier concentration of the current injection portion of the current confinement layer.

According to another aspect of the present invention, there is provided a light source including a surface emitting laser and a controller that applies a modulation voltage with approximately same positive and negative amplitudes from a bias voltage to the surface emitting laser. The surface emitting laser includes a substrate, a lower multilayer mirror and an upper multilayer mirror of a periodic structure of a high refractive index layer and a low refractive index layer formed on the substrate, a first-conductivity-type contact layer and a second-conductivity-type contact layer formed between the lower multilayer mirror and the upper multilayer mirror, an active layer formed between the first-conductivity-type contact layer and the second-conductivity-type contact layer, a current confinement layer formed between the second-conductivity-type contact layer and the active layer and including a current injection portion and a current confinement portion surrounding the current injection portion, a first composition gradient layer and a second composition gradient layer formed facing each other across the current confinement layer, the first composition gradient layer being arranged on the second-conductivity-type contact layer side and the second composition gradient layer being arranged on the active layer side, a first-conductivity-type side electrode formed on the first-conductivity-type contact layer, and a second-conductivity-type side electrode formed on the second-conductivity-type contact layer. The first composition gradient layer and the second composition gradient layer are formed such that bandgap energy of each of the layers is monotonically decreased from the current confinement layer to an adjacent layer and approach bandgap energy of the adjacent layer in a growth direction. The second-conductivity-type cladding layer includes material for reducing mobility of carrier. Carrier concentration of the second composition gradient layer is equal to or more than carrier concentration of the current injection portion of the current confinement layer.

According to still another aspect of the present invention, there is provided an optical module including a surface emitting laser that includes a substrate, a lower multilayer mirror and an upper multilayer mirror of a periodic structure of a high refractive index layer and a low refractive index layer formed on the substrate, a first-conductivity-type contact layer and a second-conductivity-type contact layer formed between the lower multilayer mirror and the upper multilayer mirror, an active layer formed between the first-conductivity-type contact layer and the second-conductivity-type contact layer, a current confinement layer formed between the second-conductivity-type contact layer and the active layer and including a current injection portion and a current confinement portion surrounding the current injection portion, a first composition gradient layer and a second composition gradient layer formed facing each other across the current confinement layer, the first composition gradient layer being arranged on the second-conductivity-type contact layer side and the second composition gradient layer being arranged on the active layer side, a first-conductivity-type side electrode formed on the first-conductivity-type contact layer, and a second-conductivity-type side electrode formed on the second-conductivity-type contact layer. The first composition gradient layer and the second composition gradient layer are formed such that bandgap energy of each of the layers is monotonically decreased from the current confinement layer to an adjacent layer and approach bandgap energy of the adjacent layer in a growth direction. The second-conductivity-type cladding layer includes material for reducing mobility of carrier. Carrier concentration of the second composition gradient layer is equal to or more than carrier concentration of the current injection portion of the current confinement layer.

The above and other objects, features, advantages and technical and industrial significance of this invention will be better understood by reading the following detailed description of presently preferred embodiment of the invention, when considered in connection with the accompanying drawings.

DETAILED DESCRIPTION OF THE PREFERRED EMBODIMENTS

Exemplary embodiments of the present invention are described below in detail with reference to accompanying drawings. However, the embodiments should not be construed to limit the invention, and various modifications may be made within the spirit and scope of the present invention.

When a bias current equal to or larger than a threshold current is applied to a surface emitting laser having a conventional structure, the element resistance changes according to applied bias current and ambient temperature. Accordingly, if the element resistance is increased when applying a modulation voltage as a signal to the element, the modulation voltage must be increased or the bias current must be increased, causing an increase of the power consumption.

To deal with this problem, the applicant discloses a configuration of a surface emitting laser that can reduce the power consumption in U.S. patent application Ser. No. 13/075,302, filed on Jul. 30, 2011, which is incorporated herein by reference.

Figure 13:
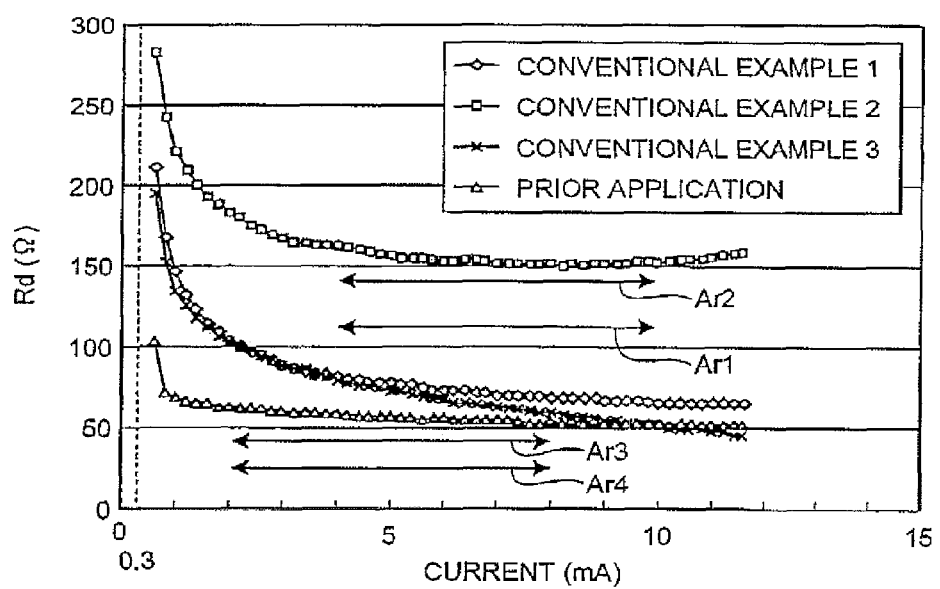
FIG. 13 is a graph showing an example of driving current-differential resistance characteristics of a surface emitting laser according to conventional examples 1 to 3 and the prior application.

FIG. 13 is a graph showing an example of driving current-differential resistance (I-Rd) characteristics of surface emitting lasers according to conventional examples 1 to 3 and the prior application. Arrows Ar 1 to Ar 4 show ranges of currents applied to the surface emitting lasers according to conventional examples 1 to 3 and the prior application, respectively.

As shown in FIG. 13, the surface emitting lasers according to the conventional examples 1 and 3 have I-Rd characteristics in which the differential resistance varies as the current increases across a wide current range on the low current side. The surface emitting laser according to the conventional example 2 has a small variation of the differential resistance with a change of the current, but has I-Rd characteristics in which a variation of the differential resistance increases when the ambient temperature changes. In contrast, the surface emitting laser according to the prior application has I-Rd characteristics in which a variation of the differential resistance is small with changes of both the current and the ambient temperature to a considerably low current range. Because the surface emitting laser according to the prior application has a small variation of the differential resistance, even when a modulation voltage having approximately the same amplitude Vm in the positive and negative sides around the bias voltage as a center are applied to the surface emitting laser, a modulation current Im+ corresponding to the amplitude +Vm in the positive side and a modulation current Im− corresponding to the amplitude −Vm in the negative side become symmetric with respect to a bias current Ib approximately as low as 5 mA. As a result, the amplitudes of the power of the output laser signal light in the positive and negative sides around the light power as a center corresponding to the bias current also become symmetric. Consequently, it is possible to prevent an increase of the average modulation current to obtain an optical signal with a predetermined extinction ratio, thereby reducing the power consumption.

In order to further reduce the power consumption of the surface emitting laser, it is preferable that the bias current be as low as possible, for example, equal to or lower than 2 mA, being close to the threshold current. However, as shown in FIG. 13, in the surface emitting laser according to the prior application, the differential resistance increases when the bias current is 1 mA or lower, for example, about 0.3 mA, which is around the threshold current of the surface emitting laser. Thus, for a further reduction of power consumption, a surface emitting laser in which a variation of differential resistance is suppressed even when the current is around the threshold current equal to or lower than 1 mA.

According to the embodiments of the present invention, the power consumption of the surface emitting laser can be further reduced.

Figure 1:
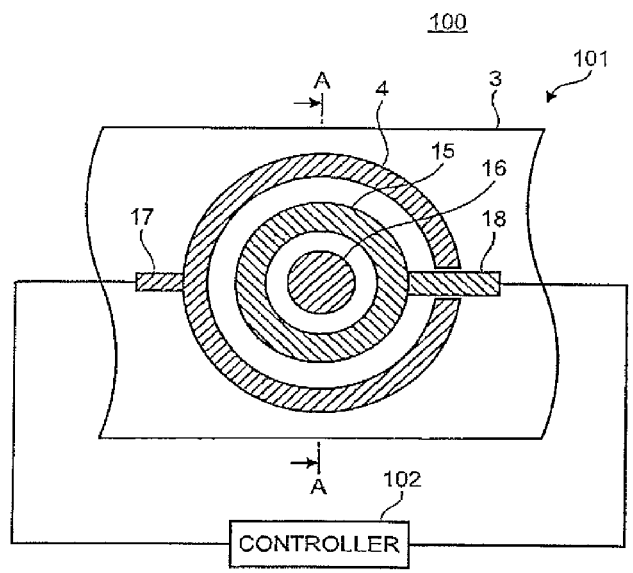
FIG. 1 is a schematic of a light source according to a first embodiment of the present invention.
Figure 2:
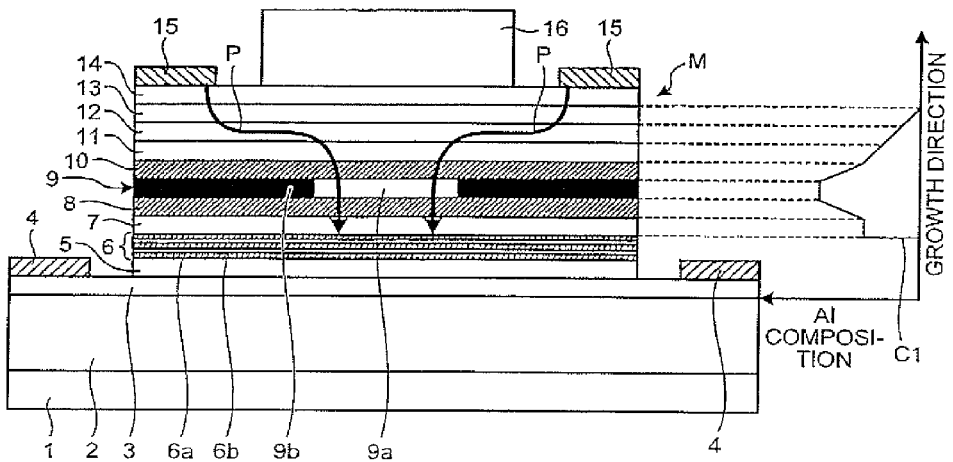
FIG. 2 is a cross-sectional view of an essential portion of a surface emitting laser shown in FIG. 1 along a line A-A.

FIG. 1 is a schematic of a light source 100 according to a first embodiment of the present invention. The light source 100 includes a surface emitting laser 101 and a controller 102. FIG. 2 is a cross-sectional view of an essential portion of the surface emitting laser 101 along a line A-A shown in FIG. 1.

The surface emitting laser 101 includes an undoped lower DBR mirror 2 as a lower multilayer mirror formed on an n-type GaAs substrate 1 having a plane orientation (001), an n-type contact layer 3, an n-side electrode 4, an n-type cladding layer 5, an active layer 6, a p-type cladding layer 7, a lower composition gradient layer 8 as a second composition gradient layer, a current confinement layer 9, an upper composition gradient layer 10 as a first composition gradient layer, a p-type spacer layer 11, a p-type high-conductivity layer 12, a p-type spacer layer 13, a p-type contact layer 14, a p-side electrode 15, an upper DBR mirror 16 as an upper multilayer mirror, an n-side lead electrode 17, and a p-side lead electrode 18.

The p-type contact layer 14 and the n-type contact layer 3 are formed between the lower DBR mirror 2 and the upper DBR mirror 16. The active layer 6 is formed between the p-type contact layer 14 and the n-type contact layer 3. The current confinement layer 9 is formed between the p-type contact layer 14 and the active layer 6. The upper composition gradient layer 10 and the lower composition gradient layer 8 are formed facing each other across the current confinement layer 9. The upper composition gradient layer 10 is arranged on the p-type contact layer 14 side, and the lower composition gradient layer 8 is arranged on the active layer 6 side. The p-type high-conductivity layer 12 is formed between the p-type contact layer 14 and the current confinement layer 9. The p-type electrode 15 is formed on the p-type contact layer 14, and the n-side electrode 4 is formed on the n-type contact layer 3.

A layer structure from the n-type cladding layer 5 to the p-type contact layer 14 is formed as a mesa post M having a columnar shape by etching processing and the like. The diameter of the mesa post M is, for example, 30 μm. The n-type contact layer 3 is extended to the outer peripheral side of the mesa post M. The lower DBR mirror 2 and the upper DBR mirror 16 form an optical resonator.

The lower DBR mirror 2 is formed on an undoped GaAs buffer layer (not shown) grown on the n-type GaAs substrate 1. The lower DBR mirror 2 is formed as a semiconductor multilayer mirror including, for example, 40.5 pairs of an $Al_{0.9}Ga_{0.1}As$ semiconductor layer as a low refractive index layer and a GaAs semiconductor layer as a high refractive index layer. The thickness of each of the layers of the lower DBR mirror 2 is $\lambda/4n$ ($\lambda$ is oscillation wavelength and n is refractive index).

The n-type contact layer 3 and the n-type cladding layer 5 are formed of n-type GaAs material. The p-type cladding layer 7 is formed of p-type AlGaAs material (for example, $Al_{0.3}Ga_{0.7}As$ is preferable). The n-type cladding layer 5 and the p-type cladding layer 7 are formed facing each other across the active layer 6, thereby forming a separate confinement heterostructure (SCH).

The p-type spacer layer 11, the p-type high-conductivity layer 12, and the p-type spacer layer 13 are formed of p-type AlGeAs material. The p-type contact layer 14 is formed of p-type GaAs material.

The n-type cladding layer 5, the p-type cladding layer 7, and the p-type spacer layers 11 and 13 are doped with p-type or n-type dopant so that the carrier concentration is, for example, approximately $1 \times 10^{18}$ cm$^{-3}$. Accordingly, the n-type cladding layer 5, the p-type cladding layer 7, and the p-type spacer layers 11 and 13 surely have p-type or n-type conductivity. The carrier concentrations of the n-type contact layer 3 and the p-type contact layer 14 are, for example, approximately $2 \times 10^{18}$ cm$^{-3}$ and $3 \times 10^{19}$ cm$^{-3}$, respectively. The carrier concentration of the p-type high-conductivity layer 12 is $3 \times 10^{19}$ cm$^{-3}$ and its conductivity is higher than those of the p-type spacer layers 11 or 13. The p-type high-conductivity layer 12 forms a path of the current injected from the p-side electrode 15 in the transverse direction of the drawing, and allows the current to be injected into the active layer 6 more effectively.

It is preferable that the carrier concentration of the p-type high-conductivity layer 12 is equal to or more than $3 \times 10^{19}$ cm$^{-3}$ to achieve high conductivity and low resistance. It is also preferable that the carrier concentration thereof is equal to or lower than $1 \times 10^{21}$ cm$^{-3}$ in terms of the manufacturability. If the carrier concentration is $3 \times 10^{19}$ cm$^{-3}$ the resistivity of the p-type high-conductivity layer 12 of AlGaAs is $4 \times 10^{-3}$ Ω·cm. Accordingly, if the thickness of the p-type high-conductivity layer 12 is 30 nm, a value obtained by dividing the thickness by the resistivity is equal to or more than $7 \times 10^{-4}/\Omega$. Two or more layers of the p-type high-conductivity layer can be provided.

The current confinement layer 9 has an opening portion 9a as a current injection portion and a selectively oxidized layer 9b as a current confinement portion. The opening portion 9a is formed of $Al_{1-x}Ga_xAs$ ($0 \leq x < 0.2$) and the selectively oxidized layer 9b is formed of $(Al_{1-x}Ga_x)_2O_3$, where x is 0.2, for example. The thickness of the current confinement layer 9 is, for example, 30 nm, and the current confinement layer 9 is formed by performing a selective thermal oxidation process on an Al-containing layer formed of $Al_{1-x}Ga_xAs$. The selectively oxidized layer 9b is formed in a ring shape surrounding the opening portion 9a because the Al containing layer is oxidized from the outer peripheral portion as much as a predetermined area along a growth plane. The selectively oxidized layer 9b has insulating characteristics and the current density in the active layer 6 just below the opening portion 9a is increased, because the current injected from the p-side electrode 15 is confined and concentrated into the opening portion 9a. The diameter of the opening portion 9a is, for example, 6 μm, which is preferably 4 μm to 15 μm, and more preferably, 5 μm to 10 μm.

The current confinement layer 9 is formed so that the distance from the center of the active layer 6 to the center of the current confinement layer 9 in the growth direction falls within a range from $\lambda/4n$ to $7\lambda/4n$, preferably, from $3\lambda/4n$ to $5\lambda/4n$, where n is an equivalent refractive index of the layers from the active layer 6 to the current confinement layer 9. Because a dislocation tends to occur in the active layer 6 due to the stress of the selectively oxidized layer 9b, it is desirable that the distance from the center of the active layer 6 to the center of the current confinement layer 9 be equal to or more than 3λ/4n to improve reliability, and to prevent a degradation of the modulation efficiency, it is preferable that the distance be equal to or less than 5λ/4n. The thicknesses of other layers are adjusted such that an antinode of a standing wave of light in the optical resonator is formed at the position of the active layer 6, and a node of the standing wave is formed at the positions of the current confinement layer 9 and the p-type high-conductivity layer 12.

The lower composition gradient layer 8 and the upper composition gradient layer 10 are formed of AlGaAs material with the Al composition increasing monotonically in a stepwise manner or in a continuous manner toward the current confinement layer 9 in the growth direction and thus the Al composition becomes close to the Al composition of the current confinement layer 9.

The lower composition gradient layer 8, at least the opening portion 9a of the current confinement layer 9, and the upper composition gradient layer 10 are doped with p-type dopant so that the carrier concentration is $2 \times 10^{19}$ cm$^{-3}$.

The active layer 6 has a multiple quantum well (MQW) structure including three layers of well layers 6a and two layers of barrier layers 6b alternately formed. The well layer 6a is formed of GaInAs-based semiconductor material such as $Ga_{0.75}In_{0.25}As$. The barrier layer 6b is formed of, for example, GaAs. The composition and thickness of the semiconductor material in the active layer 6 are set such that spontaneous emission light containing light having a wavelength longer than 850 nm is emitted by the current injected from the p-side electrode 15 and confined by the current confinement layer 9.

The upper DBR mirror 16 is formed as a dielectric multilayer mirror in which, for example, nine pairs of a $SiO_2$ layer as a low refractive index layer and a SiN layer as a high refractive index layer. Similar to the lower DBR mirror 2, the thickness of each layer of the upper DBR mirror 16 is λ/4n. The diameter of the upper DBR mirror 16 is smaller than the diameter of the p-type contact layer 14. Accordingly, the p-type contact layer 14 is extended to the outer peripheral side of the upper DBR mirror 16.

The p-side electrode 15 is formed on the surface of the extended portion of the p-type contact layer 14 in a ring shape to surround the upper DBR mirror 16. The p-side electrode 15 is directly formed on the p-type contact layer 14 without interposing the upper DBR mirror 16 therebetween. The n-side electrode 4 is formed on the surface of the extended portion of the n-type contact layer 3 extended at the outer peripheral side of the mesa post M, and is formed in a C-shape to surround the periphery of the mesa post M. In other words, the n-side electrode 4 is directly formed on the n-type contact layer 3 without interposing the lower DBR mirror 2 therebetween. The n-side lead electrode 17 is connected to the n-side electrode 4 and the p-side lead electrode 18 is connected the p-side electrode 15.

The controller 102 is electrically connected to the p-side electrode 15 and the n-side electrode 4 through the p-side lead electrode 18 and the n-side lead electrode 17, respectively. The controller 102 is configured to apply a predetermined bias voltage and a modulation voltage as a signal having approximately the same positive and negative amplitudes from the bias voltage, between the p-side electrode 15 and the n-side electrode 4. The controller 102 is, for example, a known IC driver for driving a laser. The modulation frequency of the modulation voltage is, for example, equal to or higher than 10 GHz.

The layers from the p-type spacer layer 11 to the p-type contact layer 14 are formed of $Al_{1-y}Ga_yAs$ (x<y≤1). However, as described above, because the n-type contact layer 3 and the n-type cladding layer 5 are formed of GaAs, y=1. The layers from the p-type cladding layer 7 to the n-type contact layer 3 are formed of $Al_{1-z}Ga_zAs$ (x<z≤1). However, z≠1 in the p-type cladding layer 7, so that the p-type cladding layer 7 definitely includes Al. As described above, because the p-type contact layer 14 is formed of GaAs, z=1.

When the layers from the p-type spacer layer 11 to the p-type spacer layer 13 satisfy y=1, i.e., are formed of GaAs, the upper composition gradient layer 10 is formed such that its Al composition is decreased monotonically in a stepwise manner or in a continuous manner in the growth direction from the current confinement layer 9 side to the p-type spacer layer 11 side, and approaches the composition of GaAs.

On the other hand, when the layers from the p-type spacer layer 11 to the p-type spacer layer 13 satisfy y≠1, i.e., are formed of $Al_{1-y}Ga_yAs$ (x<y≤1), as indicated by a line C1 in FIG. 2, the upper composition gradient layer 10 is formed such that its Al composition is decreased monotonically in a stepwise manner or in a continuous manner in the growth direction from the current confinement layer 9 side to the p-type spacer layer 11 side, and approaches the Al composition of the p-type spacer layer 11. The Al composition of the layers from the p-type spacer layer 11 to the p-type spacer layer 13 in the growth direction is monotonically reduced from the upper composition gradient layer 10 towards the p-type contact layer 14 in a stepwise manner or in a continuous manner.

The lower composition gradient layer 8 is formed such that its Al composition is decreased monotonically in a stepwise manner or in a continuous manner in the growth direction from the current confinement layer 9 side to the p-type cladding layer 7 side, and approaches the Al composition of the p-type cladding layer 7. Because the Al composition is reduced in the above manner, the bandgap energy is monotonically decreased from the current confinement layer 9 towards the p-type contact layer 14 and from the current confinement layer 9 towards the n-type contact layer 3 bypassing quantum well or quantum dot of the active layer 6. The expression that "the Al composition or the bandgap energy is monotonically reduced" means that "the Al composition or the bandgap energy is not increased along the way". Accordingly, the Al composition or the bandgap energy may be reduced in a continuous manner or in a stepwise manner. The word "bypassing" means "skipping". For example, the change (reduction) of the Al composition or the bandgap energy is considered as "continuous" when the Al composition or the bandgap energy is continuously changed (reduced) along a virtual line which is drawn by skipping the quantum well or the quantum dot, even if the discontinuity of the Al composition or the bandgap energy exists at the quantum well or the quantum dot.

As described above, the lower composition gradient layer 8 and the upper composition gradient layer 10 are formed of AlGaAs, and the Al composition and bandgap energy of each of the layers are both monotonically decreased in a stepwise manner or in a continuous manner in the growth direction, from the current confinement layer 9 to an adjacent layer, and approach Al composition and bandgap energy of the adjacent layer.

Operations of the light source 100 will be described below. The controller 102 applies a bias voltage and a modulation voltage between the p-side electrode 15 and the n-side electrode 4, thereby injecting current. As indicated by a path P shown in FIG. 2, carriers (holes) at the p-side mainly move from the p-side electrode 15, pass through the p-type contact layer 14 and the p-type spacer layer 13, flow through the p-type high-conductivity layer 12 having high conductivity in the transverse direction in the drawing, then pass through the p-type spacer layer 11 and the upper composition gradient layer 10, and finally injected into the active layer 6 via the lower composition gradient layer 8, in a state in which the carriers are concentrated into the opening portion 9a of the current confinement layer 9 and the density thereof is increased. Carriers (electrons) at the n-side pass through the n-side electrode 4, the n-type contact layer 3, and the n-type cladding layer 5, and are injected into the active layer 6.

The active layer 6 into which the carriers are injected emits spontaneous emission light. The generated spontaneous emission light is optically amplified and resonates in the optical resonator, thereby oscillating, a laser light of a wavelength equal to or longer than 850 nm, for example, a wavelength in a 1000-nm band. As a result, the surface emitting laser 101 outputs a laser signal light including the modulation signal from the upper DBR mirror 16.

As described above, the p-side electrode 15 is formed directly on the p-type contact layer 14 without interposing the upper DBR mirror 16 therebetween. The n-side electrode 4 is also formed directly on the n-type contact layer 3 without interposing the lower DBR mirror 2 therebetween. As a result, the number of hetero interfaces that are interfaces of heterogeneous materials between the p-side electrode 15 and the active layer 6 and between the n-side electrode 4 and the active layer 6, is reduced. The Al composition reduces monotonically from the current confinement layer 9 towards the p-type contact layer 14, and reduces monotonically from the current confinement layer 9 towards the n-type contact layer 3. Accordingly, the band offset at the hetero interfaces is also changed monotonically.

When current is applied to a surface emitting laser having a conventional structure in which the p-side electrode is formed on the upper DBR mirror, for example, at a room temperature, the current is injected from the p-side electrode as holes, but some holes are trapped at a large number of hetero interfaces present in the upper DBR mirror, thereby the differential resistance of the surface emitting laser increases. When the barrier energy at the hetero interfaces is $\phi B$, the differential resistance is proportional to $1/\exp(-\phi B/kT)$, where k is Boltzmann constant, T is absolute temperature, and $\phi B$ is approximately 60 meV.

In general, the temperature of the surface emitting laser is increased as more current is injected. As a result, the holes gain thermal energy, thereby the proportion of the holes trapped at the hetero interfaces decreases. Accordingly, the differential resistance is also reduced as indicated by the above expression. In other words, the conventional surface emitting laser has the I-Rd characteristics in which the differential resistance is reduced as the driving current increases. For example, in the surface emitting laser disclosed in N. Suzuki, et al., "25-Gbps operation of 1.1-μm-range InGaAs VCSELs for high-speed optical interconnections", OFA4, OFC2006, the number of hetero interfaces present between the p-side electrode and the active layer is quite a large number from approximately 70 to 210 just in the upper DBR mirror made of 35 pairs of layers.

In the surface emitting laser 101 according to the first embodiment, as described above, the number of hetero interfaces present between the p-side electrode 15 and the active layer 6 is significantly small compared to those of the conventional technique. The band offset at the hetero interfaces is also changed monotonically. Accordingly, the energy level in the path of the carriers does not have up and down, and the energy level changes monotonically. As a result, the proportion of the holes trapped at the hetero interfaces is extremely small even at the room temperature. Consequently, even if the temperature of the element is increased, the differential resistance does not vary significantly. As for electrons, which are carriers injected from the n-side electrode 4, the number of hetero interfaces through which the electrons injected from the a-side electrode 4 to the active layer 6 pass is small. In addition, the band offset also changes monotonically. As a result, the variation of the differential resistance is further reduced. It is preferable that the number of hetero interfaces present between the p-side electrode 15 and the active layer 6 is 30 or less.

In the surface emitting laser 101, as shown in the path P in FIG. 2, when carriers are injected from the p-side electrode 15 to the opening portion 9a of the current confinement layer 9, the carriers pass through the p-type high-conductivity layer 12 having a low resistivity. After the current is confined by the opening portion 9a, the carriers are injected into the active layer 6 through the p-type cladding layer 7 formed of AlGaAs. Al is a chemical element that reduces the mobility of the carriers as a composition. Accordingly, the mobility of the carriers in AlGaAs is smaller than that in GaAs. Consequently, the current is prevented from spreading in the transverse direction. As a result, even if the temperature of the element is changed, the current path is kept stable. Accordingly, the variation of the differential resistance is further reduced.

If the distance from the center of the active layer 6 to the center of the current confinement layer 9 is set equal to or more than $3\lambda/4$, the reliability of the active layer 6 is preferably improved. Even if the distance between the current confinement layer 9 and the active layer 6 is separated in this manner, because the p-type cladding layer 7 is formed of AlGaAs as described above, the current is prevented from spreading in the transverse direction.

The mobility $\mu$ of the holes in the p-type high-conductivity layer 12 is proportional to $400(300/T)^{2.3}$, regardless of the semiconductor material. Accordingly, if the temperature of the element is increased, the mobility is reduced, and the differential resistance is increased. When the differential resistance is increased, it acts to cancel the reduction of the differential resistance due to the carrier trap at the hetero interfaces. Consequently, the variation of the differential resistance is further reduced.

In the surface emitting laser 101 according to the first embodiment, the differential resistance varies only slightly relative to the current equal to or larger than the threshold current, under the combined actions as described above. If the laser oscillation wavelength of the surface emitting laser is equal to or longer than 850-nm band, or in particular, equal to or longer than 1000-nm band, the bandgap energy of the active layer is small. Accordingly, the bias voltage can be further reduced and the surface emitting laser 101 can be driven with more preferably lower power consumption.

In the surface emitting laser 101 according to the first embodiment, the p-type carrier concentration of the lower composition gradient layer 8 is $2 \times 10^{19}$ cm$^{-3}$. Because the p-type carrier concentration of the lower composition gradient layer 8 is equal to or more than the carrier concentration of the current confinement layer 9 as described above, even if the current is equal to or lower than 1 mA, the increase of the differential resistance can be suppressed.

Specific description will be provided below using a simulation calculation result. First, a description will be provided for the relation between the current density flowing from the upper composition gradient layer 10 to the lower composition gradient layer 8 through the current confinement layer 9 and the differential resistance Rd near the current confinement layer 9, when the diameter of the opening portion 9a is set to a predetermined value and the p-type carrier concentration of the lower composition gradient layer 8 is changed in the surface emitting laser 101 in FIG. 1. The differential resistance Rd near the current confinement layer 9 means the differential resistance in an area from the upper composition gradient layer 10 to the lower composition gradient layer 8 via the current confinement layer 9. The thicknesses of the upper composition gradient layer 10, the current confinement layer 9, and the lower composition gradient layer 8 are 10 nm, 30 nm, and 15 nm, respectively. The thickness of the lower composition gradient layer 8 is preferably 3 nm to 40 nm.

Figure 3:
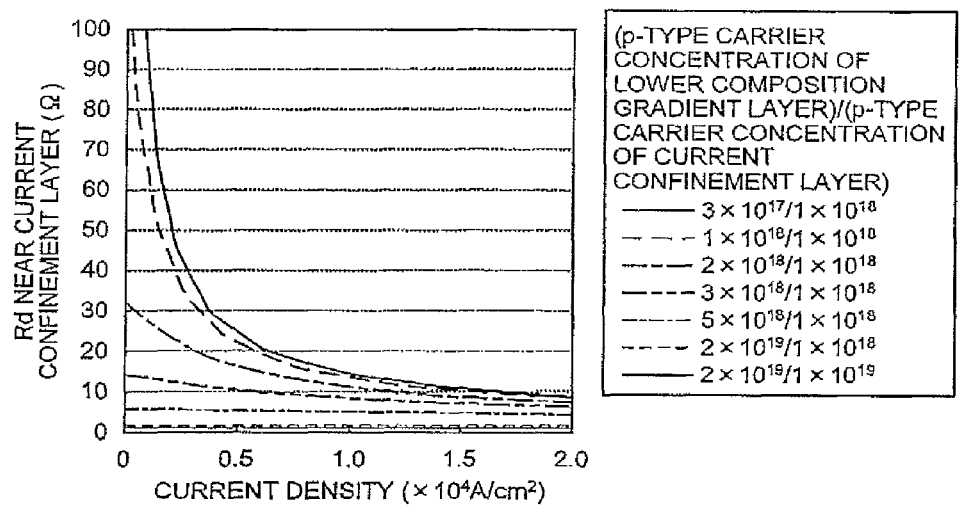
FIG. 3 is a graph showing a relation between current density and differential resistance near a current confinement layer, when a p-type carrier concentration of a lower composition gradient layer is changed.

FIG. 3 is a graph showing the relation between the current density and the differential resistance of the current confinement layer, when the p-type carrier concentration of the lower composition gradient layer is changed. The values in the legend of FIG. 3 indicate (the p-type carrier concentration of the lower composition gradient layer 8)/(the p-type carrier concentration of the current confinement layer 9). The p-type carrier concentration of the upper composition gradient layer 10 is $2 \times 10^{19}$ cm$^{-3}$ in any case. The case where the current density is $2.6 \times 10^3$ A/cm$^2$ corresponds to the current value of 1 mA.

As shown in FIG. 3, when the p-type carrier concentration of the lower composition gradient layer 8 is $3 \times 10^{17}$ cm$^{-3}$, the differential resistance Rd drastically increases in an area in which the current density is small. The conventional surface emitting laser is used with a bias current of 5 mA and thus the resistance components near the layer subjected to oxidation is not important. Thus, with a concern about an increase in the optical absorption loss, a low p-type carrier concentration of order of $10^{17}$ cm$^{-3}$ is used for the lower composition gradient layer. However in the first embodiment, a case is assumed that the surface emitting laser is used with a low bias current ($2.6 \times 10^3$ A/cm$^2$) of approximately 1 mA, and the increase of differential resistance Rd is suppressed by increasing the p-type carrier concentration of the lower composition gradient layer 8. If the p-type carrier concentration of the lower composition gradient layer 8 is $2 \times 10^{19}$ cm$^{-3}$, the differential resistance Rd is kept at an approximately constant value not depending on the current density. When the p-type carrier concentration of the lower composition gradient layer 8 is $2 \times 10^{19}$ cm$^{-3}$, the differential resistance Rd is almost the same not depending on whether the p-type carrier concentration of the current confinement layer 9 is $1 \times 10^{18}$ cm$^{-3}$ or $1 \times 10^{19}$ cm$^{-3}$. As described above, the characteristics of the differential resistance Rd greatly depend on the p-type carrier concentration of the lower composition gradient layer 8.

As a result or inventors' efforts and examinations, it was firstly confirmed that the increase of the differential resistance on the lower current side in the I-Rd characteristics of the surface emitting laser can be suppressed by increasing the p-type carrier concentration of the lower composition gradient layer, which is arranged on the side of the active layer with respect to the current confinement layer.

Figure 4:
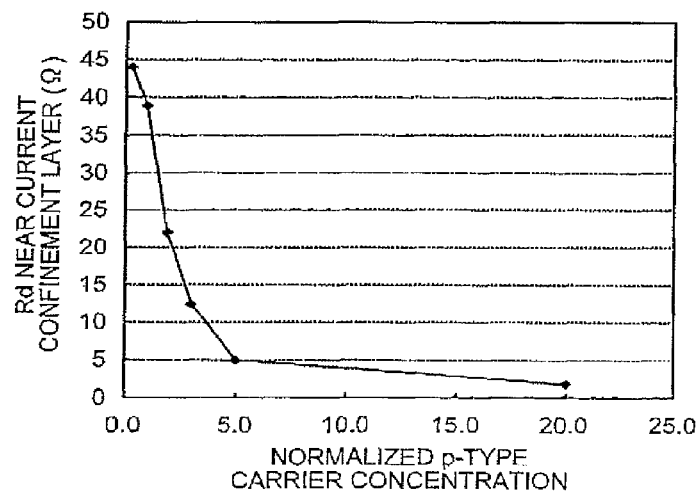
FIG. 4 is a graph showing a relation between p-type carrier concentration of the lower composition gradient layer and differential resistance near the current confinement layer, when a current value is 1 mA.

FIG. 4 is a graph showing the relation between the p-type carrier concentration of the lower composition gradient layer 8 and the differential resistance Rd near the current confinement layer 9, when the current value is 1 mA, i.e., when the current density is $2.6 \times 10^3$ A/cm$^2$. The p-type carrier concentration of the upper composition gradient layer 10 is $2 \times 10^{19}$ cm$^{-3}$ and the p-type carrier concentration of the current confinement layer 9 is $1 \times 10^{18}$ cm$^{-3}$. The p-type carrier concentration of the lower composition gradient layer 8 is normalized with the p-type carrier concentration of the current confinement layer 9.

As shown in FIG. 4, when the p-type carrier concentration of the lower composition gradient layer 8 is equal to or more than the p-type carrier concentration of the current confinement layer 9 (i.e., when the normalized value is 1 or larger), the differential resistance Rd is reduced. Furthermore, when the p-type carrier concentration of the lower composition gradient layer 8 is equal to or more than $4 \times 10^{18}$ cm$^{-3}$ (i.e., when the normalized value is 4 or larger), the differential resistance Rd can be 10Ω or lower. If it is equal to or larger than $8 \times 10^{18}$ cm$^{-3}$ (i.e., when the normalized value is 8 or larger), the differential resistance Rd can be more preferably low at approximately 2 ohms.

Figure 5:
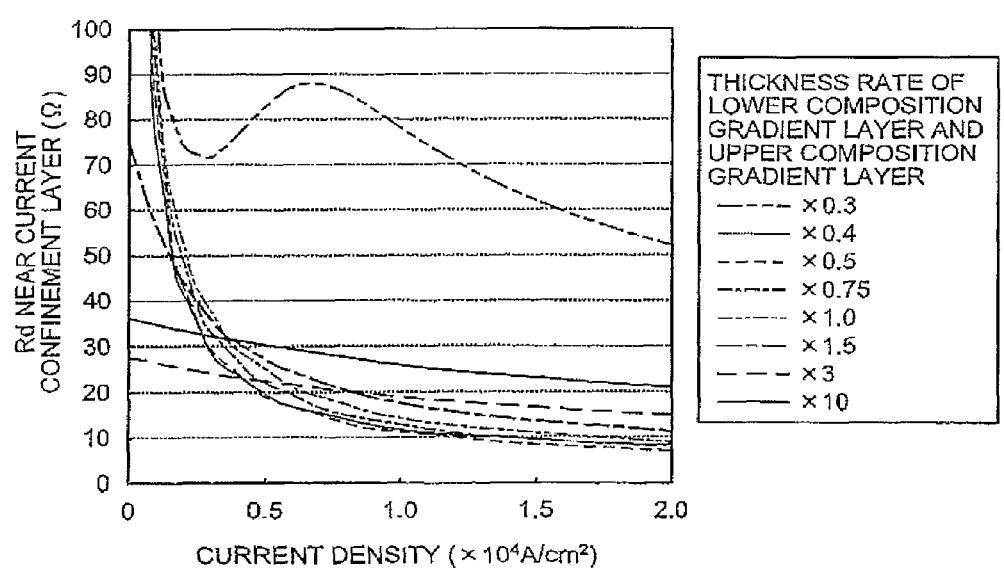
FIG. 5 is a graph showing a relation between current density and differential resistance near the current confinement layer, when thicknesses of the lower composition gradient layer and an upper composition gradient layer are changed.

The curves of the differential resistance Rd with respect to the current density or the carrier density are almost in the same shapes as that shown in FIGS. 4 and 5 as long as the diameter of the opening portion 9a of the current confinement layer 9 is in a preferable range of 4 μm to 15 μm, however, the absolute value of the differential resistance Rd may vary.

As described above, in the surface emitting laser 101 according to the first embodiment, the p-type carrier concentration of the lower composition gradient layer 8 is $2 \times 10^{19}$ cm$^{-3}$ larger than $4 \times 10^{18}$ cm$^{-3}$; therefore, even if the current is equal to or lower than 1 mA, the increase of the differential resistance is reduced to be 2 ohms smaller than 10 ohms. Accordingly, in the surface emitting laser 101 according to the first embodiment, when the bias current is 2 mA or lower, i.e., in a low-bias drive, if modulation is performed with a modulation voltage of ±0.2 V, more preferably, ±0.1 V, the extinction ratio of the output laser signal light is equal to or more than 4 decibels. Thus, the surface emitting laser 101 can be used as a signal light source applicable to the standards of 10G Ethernet.

Particularly, when the current value is equal to or approximately equal to the threshold current (for example, approximately 0.2 mA), it is preferable that the differential resistance Rd in the I-Rd characteristics of the surface emitting laser 101 does not increase. In this case, when a bias current is set that is equal to or higher than the minimum bias current with which the current value approximately equal to the threshold current is the lower limit of the modulation current, the extinction ratio of the output laser signal light is 4 decibels or more with a modulation voltage of ±0.2 V, more preferably ±0.1 V. Accordingly, the surface emitting laser 101 complies with the standards of the 10G Ethernet and thus can be used as a signal light source with significantly low power consumption.

A description will be provided below for the relation between the current density of the current, flowing from the upper composition gradient layer 10 to the lower composition gradient layer 8 via the current confinement layer 9, and the differential resistance Rd near the current confinement layer 9, when the diameter of the opening portion 9a in the surface emitting laser 101 in FIG. 1 is set to a predetermined value and the thicknesses of the lower composition gradient layer 8 and the upper composition gradient layer 10 are changed. The p-type carrier concentrations of the upper composition gradient layer 10, the current confinement layer 9, and the lower composition gradient layer 8 are $2 \times 10^{19}$ cm$^{-3}$, $1 \times 10^{18}$ cm$^{-3}$, and $3 \times 10^{17}$ cm$^{-3}$, respectively. The reference thicknesses of the upper composition gradient layer 10, the current confinement layer 9, and the lower composition gradient layer 8 are 10 nm, 30 nm, and 15 nm, respectively.

FIG. 5 is a graph showing the relation between the current density and the differential resistance Rd near the current confinement layer 9, when the thicknesses of the lower composition gradient layer 8 and the upper composition gradient layer 10 are changed. With respect to the legends of FIG. 5, for example, "×3" means that the thicknesses of the lower composition gradient layer 8 and the upper composition gradient layer 10 are three times the above-mentioned reference thicknesses. In addition, the current density of $2.6 \times 10^3$ A/cm$^2$ corresponds to a current value of 1 mA.

As shown in FIG. 5, the p-type carrier concentration of the lower composition gradient layer 8 is low at $3 \times 10^{17}$ cm$^{-3}$, even if the thicknesses of the lower composition gradient layer 8 and the upper composition gradient layer 10 are changed to be 0.3 to 10 times the reference thicknesses, the differential resistance Rd with respect to the current density of $2.6 \times 10^3$ A/cm$^2$ cannot be 20Ω or lower. In other words, in order to reduce the differential resistance Rd, it is effective that the p-type carrier concentration of the lower composition gradient layer 8 is $4 \times 10^{18}$ cm$^{-3}$ or more (see FIG. 4) as in the case of the first embodiment.

A description will be given below for the relation between the p-type carrier concentration of the lower composition gradient layer 8 and the output efficiency of the surface emitting laser 101 as well as the relation between the carrier concentration and the threshold current of the surface emitting laser 101, when the thickness of the lower composition gradient layer 8 is changed. The output efficiency is obtained by dividing the power of the laser light, which is output by the surface emitting laser 101, by the current value. The thicknesses of the upper composition gradient layer 10 and the current confinement layer 9 are 10 nm and 30 nm, respectively. In addition, the p-type carrier concentrations of the upper composition gradient layer 10 and the current confinement layer 9 are $2 \times 10^{19}$ cm$^{-3}$ and $1 \times 10^{18}$ cm$^{-3}$, respectively.

Figure 6A:
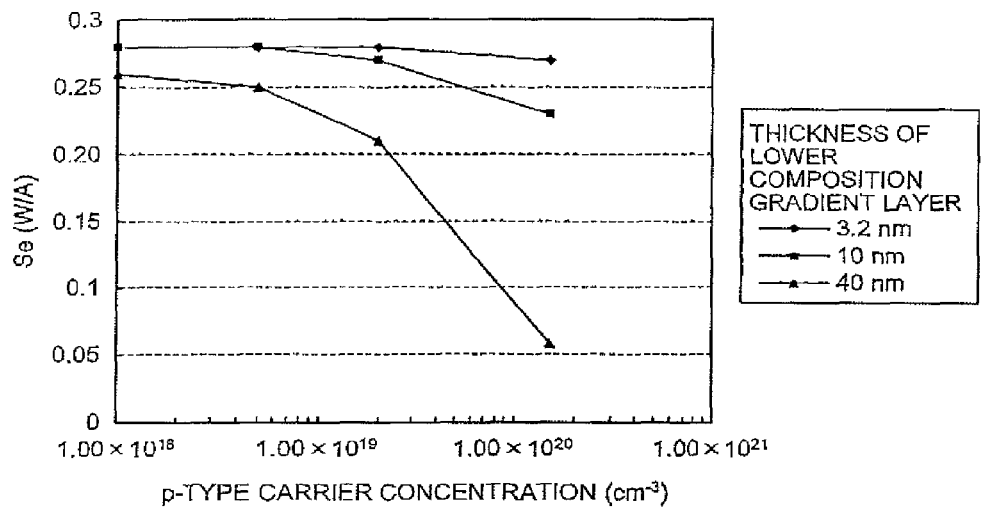
FIG. 6A is a graph showing a relation between p-type carrier concentration of the lower composition gradient layer and output efficiency of the surface emitting laser, when the thickness of the lower composition gradient layer is changed.

FIG. 6A is a graph showing the relation between the p-type carrier concentration of the lower composition gradient layer 8 and the output efficiency (Se) of the surface emitting laser 101, when the thickness of the lower composition gradient layer 8 is changed. The current value is 2 mA. In FIG. 6A, the p-type carrier concentration in the data point of the lowest p-type carrier concentration is $3 \times 10^{17}$ cm$^{-3}$. As shown in FIG. 6A, the absorption of the laser light in the lower composition gradient layer 8 increases as the p-type carrier concentration of the lower composition gradient layer 8 increases; therefore, the output efficiency Se is reduced. As the thickness of the lower composition gradient layer 8 increases, the reduction in the output efficiency Se becomes notable.

Figure 6B:
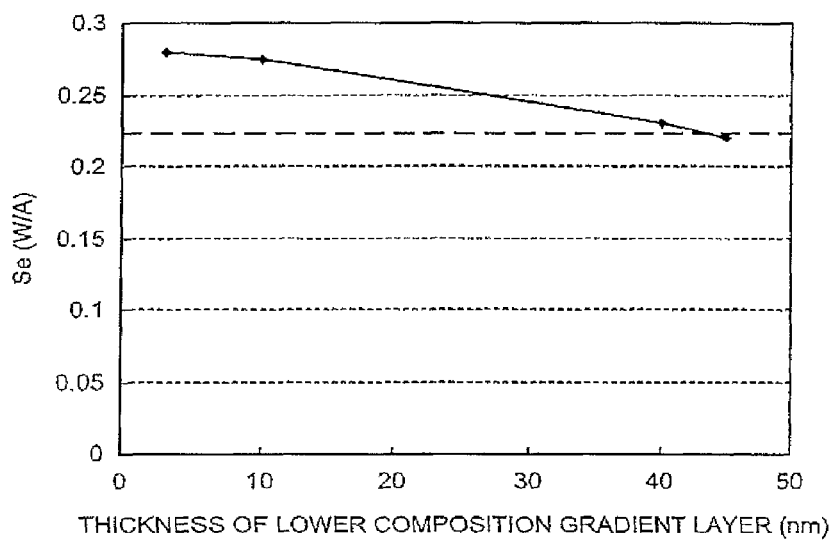
FIG. 6B is a graph showing a relation between thickness of the lower composition gradient layer and output efficiency of the surface emitting laser.

With the optimum p-type doping concentration (p-type carrier concentration) of $1 \times 10^{19}$ cm$^{-3}$ of the lower composition gradient layer 8, the output efficiency Se was calculated with the thickness of the lower composition gradient layer 8 being changed. FIG. 6B shows the results. In order to suppress the reduction of the output efficiency to be 20% or less, for example, it is preferable that the thickness of the lower composition gradient layer 8 be 40 nm or thinner. The reduction of the output efficiency Se may be suppressed to be 20% or less. Otherwise, the optical modulation amplitude (OMA) during the modulation may not be assured.

Figure 7:
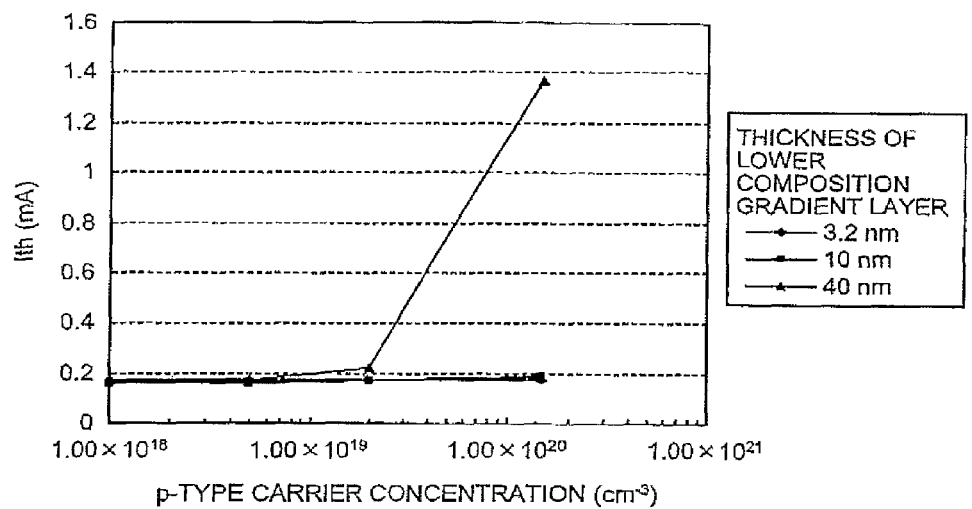
FIG. 7 is a graph showing a relation between p-type carrier concentration of the lower composition gradient layer and threshold current of the surface emitting laser.

FIG. 7 is a graph showing the relation between the p-type carrier concentration of the lower composition gradient layer 8 and the threshold current Ith of the surface emitting laser 101, when the thickness of the lower composition gradient layer 8 is changed. In FIG. 7, the p-type carrier concentration in the data point of the lowest p-type carrier concentration is $3 \times 10^{17}$ cm$^{-3}$. As shown in FIG. 7, when the thickness of the lower composition gradient layer 8 is 40 nm, the threshold current Ith increases drastically as the p-type carrier concentration of the lower composition gradient layer 8 increases.

If the output efficiency Se and the threshold current Ith, when the p-type carrier concentration of the lower composition gradient layer 8 is $3 \times 10^{17}$ cm$^{-3}$, are reference values, it is desirable that an amount of decrease of the output efficiency Se and an amount of increase of the threshold current Ith from the reference values be 20% or less. As shown in FIGS. 6A and 7, the desirable output efficiency Se and the desirable threshold current Ith (for example, approximately 0.2 mA) can be achieved if the p-type carrier concentration of the lower composition gradient layer 8 is $2 \times 10^{20}$ cm$^{-3}$ or less with the thickness of the lower composition gradient layer 8 of 3.2 nm or 10 nm, or if the p-type carrier concentration is $2 \times 10^{19}$ cm$^{-3}$ or less with the thickness of the lower composition gradient layer 8 of 40 nm.

In this manner, the light source 100 according to the first embodiment can reduce the power consumption. Accordingly, the light source 100 is suitable, particularly, as a light source for realizing high-speed transmission of 10 Gbps or more, by applying a high-rate modulation voltage of 10 GHz or higher.

As described above, in the surface emitting laser 101 according to the first embodiment, the differential resistance varies only slightly with the temperature increase of the element. Accordingly, in the surface emitting laser 101, the differential resistance varies only slightly even if the ambient temperature is changed. Consequently, the ambient temperature dependence of the optical output during modulation is small. Further, the well layer 6a is made of GaInAs-based semiconductor material in which the temperature-dependent change in the gain curve is small. Accordingly, not only the threshold current and threshold voltage are low, but also the ambient temperature dependence of injection-current versus light-output (I-L) characteristics is small. Consequently, in the light source 100 according to the first embodiment, a temperature adjusting unit such as a Peltier element may be a unit having a low cooling capacity, or the temperature adjusting unit may be unnecessary. Accordingly, the light source 100 can be made much simpler, consume low power, and can be low in cost. In addition, the drive circuit can be simple and the light source 100 can be driven even with a CMOS.

An example of a manufacturing method of the light source 100 according to the first embodiment will now be described. By using a known grown method such as a molecular beam epitaxy (MBE), a gas source MBE, a chemical beam epitaxy (CBE), and a metal-organic chemical vapor deposition (MOCVD), the lower DBR mirror 2, the n-type contact layer 3, the n-type cladding layer 5, the active layer 6, the p-type cladding layer 7, the lower composition gradient layer 8, the Al containing layer made of $Al_{1-x}Ga_xAs$ for forming the current confinement layer 9, the upper composition gradient layer 10, the p-type spacer layer 11, the p-type high-conductivity layer 12, the p-type spacer layer 13, and the p-type contact layer 14 are sequentially grown on the n-type GaAs substrate 1 on which surface the undoped GaAs buffer layer is formed.

The p-side electrode 15 is then formed on the p-type contact layer 14 by using a lift-off method. The p-side electrode 15 is then covered by a SiN film, and the mesa post M of a columnar shape is formed by etching the layers to the depth of the n-type cladding layer 5 by using an acid etching liquid and the like.

The current confinement layer 9 is then formed by selectively oxidizing the Al containing layer from the outer peripheral side of the mesa post M by performing a thermal treatment in a water-vapor atmosphere. In this manner, the current confinement layer 9 can be easily and accurately formed into a desired shape by the selective thermal oxidation process.

The n-side electrode 4 is then formed on the surface of the n-type contact layer 3 at the outer peripheral side of the mesa post M, followed by forming the n-side lead electrode 17 and the p-side lead electrode 18.

After forming the upper DBR mirror 16, the underside surface of the n-type GaAs substrate 1 is polished to a desired thickness. The elements are then separated from one another, thereby completing the surface emitting laser 101. The light source 100 is then completed by connecting the surface emitting laser 101 and the controller 102 including a known IC driver for driving a laser.

In the first embodiment, AlGaAs used for forming the p-type cladding layer 7, the p-type spacer layers 11 and 13, the p-type high-conductivity layer 12, and the like is alloy. However, the layers made of AlGaAs can be formed of digital alloy. The digital alloy may be formed of thin layers each of which has a thickness equal to or less than 2.5 nm. A miniband is formed by the tunneling effect. For example, if a pair of a GaAs layer having a thickness of 1.5 nm and an AlAs layer having a thickness of 1 nm is repeatedly arranged to form 10 pairs, such pairs can be regard as an AlGaAs layer with an average Al composition of 40% and having a thickness of 25 nm. It is satisfactory if the AlGaAs layer having the average composition has the gradient composition described above. If there is only one AlGaAs layer having a thickness equal to or less than 2.5 nm and having a high Al composition (such as 80%), carriers can be injected through the AlGaAs layer by the tunneling effect. Accordingly, the AlGaAs layer does not contribute to the increase in resistance. In this case, the AlGaAs layer can be ignored.

In addition to the structure illustrated herein, the present invention can be applied to a structure in which the parasitic capacitance is reduced by injecting ions of proton, oxygen or the like into the oxidized confinement structure.

The surface emitting laser according to, the embodiment of the present invention can also be directly modulated in the range from 10 Gbps to 40 Gbps; therefore, a surface emitting laser including low-power consumption characteristics and high-speed response can be realized. For example, the present invention achieves 10 $GHz/(mA)^{0.5}$ as an injection current efficiency (modulation conversion efficiency factor: MCEF) at the relaxation oscillation frequency (fr). In addition, the heat generation of the active layer is small because of a small resistivity and fr is not saturated unless the bias current reaches approximately 10 mA. Thus, fr can reach up to 30 GHz. The frequency band ($f_{-3dB}$) for a small signal modulation can be up to fr×1.55. Accordingly, a modulation up to 46 GHz can be performed.

Figure 8:
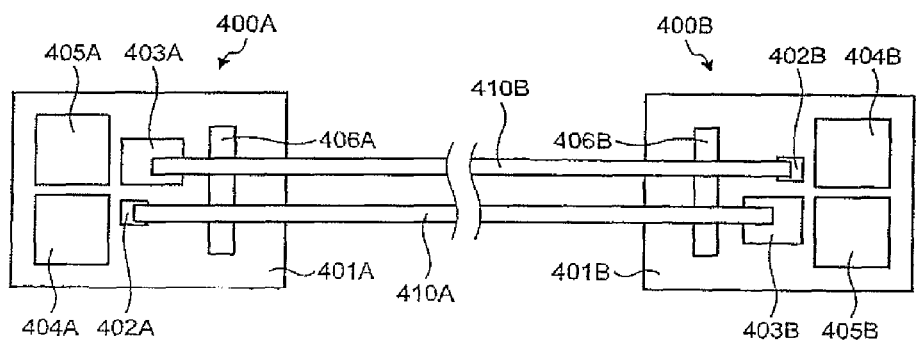
FIG. 8 is a schematic plan view showing a communication system in which two optical transmitter-receiver modules according to a second embodiment of the present invention are connected with each other via two optical waveguides.

Various optical modules can be provided by combining the surface emitting laser according to the embodiment of the present invention with an optical waveguide. FIG. 8 is a schematic plan view showing a communication system in which two optical transmitter-receiver modules 400A and 400B according to the second embodiment are connected with each other via two optical waveguides 410A and 410B. In FIG. 8, the optical transmitter-receiver module 400A includes a holding member 401A and elements provided on the holding member 401A, that is, a spacer 406A on which the optical waveguides 410A and 410B such as an optical fiber are mounted for positioning thereof, a surface emitting laser 402A according to an embodiment of the present invention that transmits optical signals via the optical waveguide 410A, a light receiving element 403A that receives the optical signals transmitted through the optical waveguide 410B and that converts the optical signals to electrical signals, a driving circuit 404A that controls the emission state of the surface emitting laser 402A, and an amplifier circuit 405A that amplifies the electrical signals converted by the light receiving element 403A. Emission from the surface emitting laser 402A is controlled by the control signals from an external controlling unit (not shown) via the driving circuit 404A. The electrical signals converted by the light receiving element 403A are transmitted to the controlling unit via the amplifier circuit 405A. To avoid complexity, wire bondings between the driving circuit 404A and the surface emitting laser 402A, and between the amplifier circuit 405A and the light receiving element 403A are not shown.

The optical transmitter-receiver module 400B has the same structure as that of the optical transmitter-receiver module 400A. However, the structure of transmission and the structure of reception are switched from those in the optical transmitter-receiver module 400A. In other words, the optical transmitter-receiver module 400B includes a holding member 401B and elements provided on the holding member 401B, that is, a spacer 406B for positioning the optical waveguides 410A and 410B, a surface emitting laser 402B according to an embodiment of the present invention that transmits optical signals via the optical waveguide 410B, a light receiving element 403B that receives the optical signals transmitted through the optical waveguide 410A and that converts the optical signals to electrical signals, a driving circuit 404B that controls the emission state of the surface emitting laser 402B, and an amplifier circuit 405B that amplifies the electrical signals converted by the light receiving element 403B. Emission from the surface emitting laser 402B is controlled by the control signals from the external controlling unit (not shown) via the driving circuit 404B. The electrical signals converted by the light receiving element 403B are transmitted to the controlling unit via the amplifier circuit 405B.

The optical transmitter-receiver modules 400A and 400B use the surface emitting lasers 402A and 402B according to the embodiment of the present invention capable of outputting high quality optical, signals by a simple control. Accordingly, the optical transmitter-receiver modules 400A and 400B can be made simple, can consume low power, and can be low in cost.

Optical coupling portions between the surface emitting laser 402A or 402B and the optical waveguide 410A or 410B of the optical transmitter-receiver module 400A or 400B shown in FIG. 8 will now be described in detail. In the following, the optical coupling portion between the surface emitting laser 402A of the optical transmitter-receiver module 400A and the optical waveguide 410A is described. However, the optical coupling portion may also be applied to the optical coupling portion between the surface emitting laser 402B of the optical transmission-reception module 400B and the optical waveguide 410B.

Figure 9:
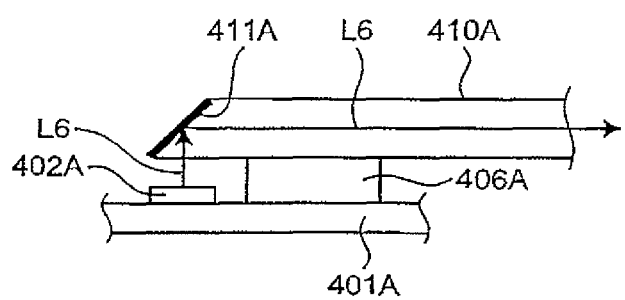
FIG. 9 is a side view of a first example of an optical coupling portion between the surface emitting laser and the optical waveguide of one of the optical transmitter-receiver modules shown in FIG. 8.

First, FIG. 9 is a side view of a first example of an optical coupling portion between the surface emitting laser 402A and the optical waveguide 410A of the optical transmitter-receiver module 400A shown in FIG. 8. As shown in FIG. 9, an end face of the optical waveguide 410A is formed to incline approximately 45 degrees relative to the optical axis. A reflection film 411A is formed on the mirror-finished end face of the optical waveguide 410A as an optical coupling unit. The relative position of the surface emitting laser 402A and the reflection film 411A is positioned by the spacer 406A, and is adjusted so that the surface emitting laser 402A is placed below the reflection film 411A. An optical signal L6 emitted from the surface emitting laser 402A is reflected by the reflection film 411A, is coupled into the optical waveguide 410A, and propagates through the optical waveguide 410A.

Figure 10:
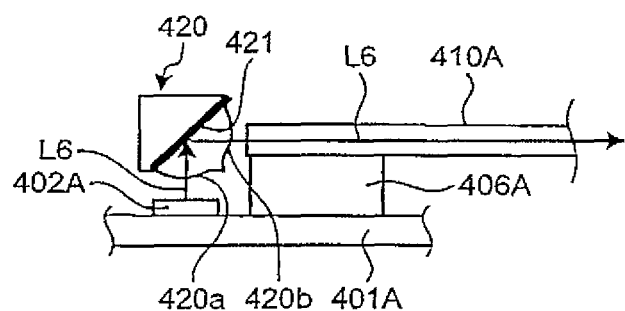
FIG. 10 is a side view of a second example of the optical coupling portion between the surface emitting laser and the optical waveguide.

FIG. 10 is a side view of a second example of the optical coupling portion between the surface emitting laser 402A and the optical waveguide 410A. In the example shown in FIG. 10, a mirror assembly 420 is provided above the surface emitting laser 402A and at the side of the end face of the optical waveguide 410A as an optical coupling unit. The mirror assembly 420 includes an input surface 420a facing the surface emitting laser 402A and an output surface 420b facing the end face of the optical waveguide 410A. A reflection surface 421 is also included in the mirror assembly 420. The optical signal L6 emitted from the surface emitting laser 402A enters the mirror assembly 420 from the input surface 420a, is reflected by the reflection surface 421, is output from the output surface 420b, is coupled at the end face of the optical waveguide 410A, and propagates through the optical waveguide 410A. A micro lens (array) for collimating or condensing may be provided on the input surface 420a and/or the output surface 420b of the mirror assembly 420.

Figure 11:
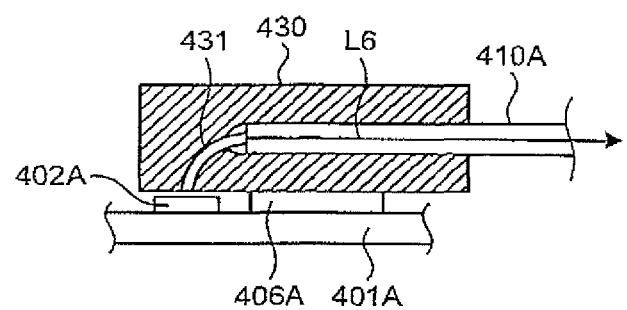
FIG. 11 is a partial cross-sectional side view of a third example of the optical coupling portion between the surface emitting laser and the optical waveguide.

FIG. 11 is a partial cross-sectional side view of a third example of the optical coupling portion between the surface emitting laser 402A and the optical waveguide 410A. In the example shown in FIG. 11, the optical waveguide 410A that is an optical fiber is held in a connector housing 430 mounted on the spacer 406A. A coated optical fiber 431 is bent smoothly as the optical coupling unit, and one end face thereof is connected to the optical waveguide 410A and the other end face thereof is held to face the surface emitting laser 402A. The optical signal L6 emitted from the surface emitting laser 402A enters the coated optical fiber 431 from the end surface, propagates through the coated optical fiber 431, is coupled into the optical waveguide 410A, and propagates therethrough.

Figure 12:
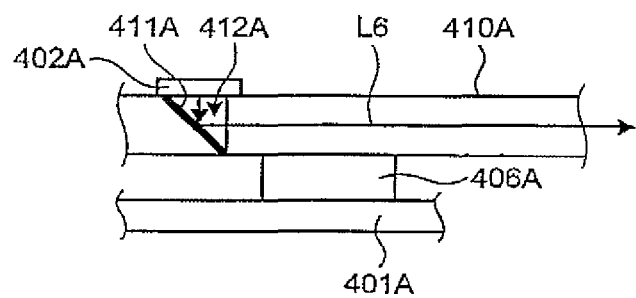
FIG. 12 is a side view of a fourth example of the optical coupling portion between the surface emitting laser and the optical waveguide.

FIG. 12 is a side view of a fourth example of the optical coupling portion between the surface emitting laser 402A and the optical waveguide 410A. In the example shown in FIG. 12, a groove 412A in a wedge shape having an inclined inner surface that is inclined approximately 45 degrees relative to the optical axis is formed on the optical waveguide 410A mounted on the spacer 406A. The reflection film 411A is formed on the mirror-finished inclined inner surface. The groove 412A and the reflection film 411A form the optical coupling unit. The surface emitting laser 402A is directly fabricated on the optical waveguide 410A at a position above the groove 412A. The surface emitting laser 402A is formed to emit the optical signal L6 towards the substrate side, in other words, in the downward direction. The optical signal L6 emitted from the surface emitting laser 402A is reflected by the reflection film 411A formed on the inclined inner surface of the groove 412A, coupled into the optical waveguide 410A, and propagates through the optical waveguide 410A.

In the surface emitting laser according to the embodiments described above, the n-type contact layer 3, the n-type cladding layer 5, and the p-type contact layer 14 are formed of GaAs not including Al. The p-type spacer layers 11 and 13 and the p-type high-conductivity layer 12 are formed of AlGaAs. However, if the condition is satisfied that the Al composition is monotonically reduced from the current confinement layer 9 towards the p-type contact layer 14 and also monotonically reduced from the current confinement layer 9 towards the n-type contact layer 3, the compositions of the layers are not limited to those in the embodiments, but for example, the n-type contact layer 3 may be formed of AlGaAs. If the condition that the Al composition is reduced monotonically is satisfied, any semiconductor layer other than the semiconductor layers in the embodiments may be included.

In the above-described embodiments, the n-type semiconductor layers are formed between the substrate and the active layer, and the p-type semiconductor layers are formed above the active layer. Alternatively, the p-type semiconductor layers may be formed between the substrate and the active layer and the n-type semiconductor layers may be formed above the active layer.

In the above-described embodiments, the entire upper DBR mirror is formed of the dielectric multilayer film. However, at least a part of the upper DBR mirror may be formed of the dielectric multilayer film and other portions may be formed of a semiconductor multilayer film. The semiconductor material for forming the surface emitting laser is not limited to the AlGaAs based material and the GaInAs based material, but other semiconductor materials such as an InP based material may also be used corresponding to the intended laser oscillation wavelength. In the embodiments, the GaAs substrate is used. However, an InP substrate may be used instead. In that case, the layer being oxidized is AlGaInAs or AlInAs. The layers from the oxidized layer to the p-type contact layer, and the layers from the oxidized layer to the n-type contact layer may be formed of AlGaInAs, and the Al composition is monotonically reduced towards the contact layers.

As described above, the surface emitting laser, the light source, and the optical module according to the present invention are suitable to be applied to fields such as optical interconnection and optical pickup.

Although the invention has been described with respect to specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A surface emitting laser comprising:
a substrate;
a lower multilayer mirror and an upper multilayer mirror of a periodic structure of a high refractive index layer and a low refractive index layer formed on the substrate;
a first-conductivity-type contact layer and a second-conductivity-type contact layer formed between the lower multilayer mirror and the upper multilayer mirror;
an active layer formed between the first-conductivity-type contact layer and the second-conductivity-type contact layer;
a current confinement layer formed between the second-conductivity-type contact layer and the active layer and including a current injection portion and a current confinement portion surrounding the current injection portion;
a first composition gradient layer and a second composition gradient layer formed facing each other across the current confinement layer, the first composition gradient layer being arranged on the second-conductivity-type contact layer side and the second composition gradient layer being arranged on the active layer side;
a second-conductivity-type cladding layer formed between the second composition gradient layer and the active layer;
a first-conductivity-type side electrode formed on the first-conductivity-type contact layer; and
a second-conductivity-type side electrode formed on the second-conductivity-type contact layer, wherein
the first composition gradient layer and the second composition gradient layer are formed such that bandgap energy of each of the layers is monotonically decreased from the current confinement layer to an adjacent layer and approach bandgap energy of the adjacent layer in a growth direction,
the second-conductivity-type cladding layer includes material for reducing mobility of carrier, and
carrier concentration of the second composition gradient layer is equal to or more than four times that of the carrier concentration of the current injection portion of the current confinement layer, the carrier concentration of the second composition gradient layer is equal to or more than $4\times10^{18}$ cm$^{-3}$ and equal to or less than $2\times10^{20}$ cm$^{-3}$, and layers from the first-conductivity-type contact layer to the second-conductivity-type contact layer except for the active layer are formed of a material chosen from AlGaAs-based, GaInAs-based, AlGaInAs-based, and InP-based semiconductor materials.

2. The surface emitting laser according to claim 1, wherein at least one of the bandgap energy of the layers from the first composition gradient layer to the second-conductivity-type contact layer and the bandgap energy of the layers from the second composition gradient layer to the first-conductivity-type contact layer is reduced in a continuous manner as being away from the current confinement layer.

3. The surface emitting laser according to claim 1, wherein at least one of the bandgap energy of the layers from the first composition gradient layer to the second-conductivity-type contact layer and the bandgap energy of the layers from the second composition gradient layer to the first-conductivity-type contact layer is reduced in a stepwise manner as being away from the current confinement layer.

4. The surface emitting laser according to claim 1, wherein
the substrate is formed of GaAs,
the current injection portion is formed of $Al_{1-x}Ga_xAs$ ($0 \leq x < 1$),
the current confinement portion is formed of $(Al_{1-x}Ga_x)_2O_3$ formed by a selective oxidation process,
the first composition gradient layer and the second composition gradient layer are formed of $Al_{1-y}Ga_yAs$ ($x < y \leq 1$) such that the Al composition of each of the layers is monotonically decreased from the current confinement layer to the adjacent layer and approaches Al composition of the adjacent layer in the growth direction.

5. The surface emitting laser according to claim 1, wherein the carrier concentration of the second composition gradient layer is equal to or more than $8\times10^{18}$ cm$^{-3}$ and equal to or less than $2\times10^{19}$ cm$^{-3}$.

6. The surface emitting laser according to claim 1, wherein the second composition gradient layer has a thickness of equal to or more than 3 nanometers and equal to or less than 40 nanometers.

7. The surface emitting laser according to claim 1, further comprising a second-conductivity-type high-conductivity layer formed between the first composition gradient layer and the second-conductivity-type contact layer.

8. The surface emitting laser according to claim 7, wherein the second-conductivity-type high-conductivity layer has carrier concentration of equal to or more than $3\times10^{19}$ cm$^{-3}$ and equal to or less than $1\times10^{21}$ cm$^{-3}$.

9. The surface emitting laser according to claim 7, wherein a value obtained by dividing a thickness of the second-conductivity-type high-conductivity layer by its resistivity is equal to or more than $7\times10^{-4}/\Omega$.

10. The surface emitting laser according to claim 1, wherein the current injection portion has a diameter of equal to or more than 4 micrometers and equal to or less than 15 micrometers.

11. The surface emitting laser according to claim 1, wherein a distance from a center of the active layer to a center of the current confinement layer in the growth direction is within a range from $\lambda/4n$ to $7\lambda/4n$, where $\lambda$ is a laser oscillation wavelength and n is an equivalent refractive index of layers from the active layer to the current confinement layer.

12. The surface emitting laser according to claim 1, wherein a distance from a center of the active layer to a center of the current confinement layer in the growth direction is within a range from $3\lambda/4n$ to $5\lambda/4n$, where $\lambda$ is a laser oscillation wavelength and n is an equivalent refractive index of layers from the active layer to the current confinement layer.

13. A light source comprising:
a surface emitting laser; and
a controller that applies a modulation voltage with approximately same positive and negative amplitudes from a bias voltage to the surface emitting laser, wherein
the surface emitting laser includes
a substrate,
a lower multilayer mirror and an upper multilayer mirror of a periodic structure of a high refractive index layer and a low refractive index layer formed on the substrate,
a first-conductivity-type contact layer and a second-conductivity-type contact layer formed between the lower multilayer minor and the upper multilayer minor,
an active layer formed between the first-conductivity-type contact layer and the second-conductivity-type contact layer,
a current confinement layer formed between the second-conductivity-type contact layer and the active layer and including a current injection portion and a current confinement portion surrounding the current injection portion,
a first composition gradient layer and a second composition gradient layer formed facing each other across the current confinement layer, the first composition gradient layer being arranged on the second-conductivity-type contact layer side and the second composition gradient layer being arranged on the active layer side,
a second-conductivity-type cladding layer formed between the second composition gradient layer and the active layer,
a first-conductivity-type side electrode formed on the first-conductivity-type contact layer, and
a second-conductivity-type side electrode formed on the second-conductivity-type contact layer,
the first composition gradient layer and the second composition gradient layer are formed such that bandgap energy of each of the layers is monotonically decreased from the current confinement layer to an adjacent layer and approach bandgap energy of the adjacent layer in a growth direction,
the second-conductivity-type cladding layer includes material for reducing mobility of carrier, and
carrier concentration of the second composition gradient layer is equal to or more than four times that of the carrier concentration of the current injection portion of the current confinement layer,
the carrier concentration of the second composition gradient layer is equal to or more than $4\times10^{18}$ cm$^{-3}$ and equal to or less than $2\times10^{20}$ cm$^{-3}$, and
layers from the first-conductivity-type contact layer to the second-conductivity-type contact layer except for the active layer are formed of a material chosen from AlGaAs-based, GaInAs-based, AlGaInAs-based, and InP-based semiconductor materials.

14. An optical module comprising a surface emitting laser that includes
a substrate, a lower multilayer mirror and an upper multilayer mirror of a periodic structure of a high refractive index layer and a low refractive index layer formed on the substrate, a first-conductivity-type contact layer and a second-conductivity-type contact layer formed between the lower multilayer mirror and the upper multilayer mirror, an active layer formed between the first-conductivity-type contact layer and the second-conductivity-type contact layer, a current confinement layer formed between the second-conductivity-type contact layer and the active layer and including a current injection portion and a current confinement portion surrounding the current injection portion, a first composition gradient layer and a second composition gradient layer formed facing each other across the current confinement layer, the first composition gradient layer being arranged on the second-conductivity-type contact layer side and the second composition gradient layer being arranged on the active layer side, a second-conductivity-type cladding layer formed between the second composition gradient layer and the active layer, a first-conductivity-type side electrode formed on the first-conductivity-type contact layer, and a second-conductivity-type side electrode formed on the second-conductivity-type contact layer, the first composition gradient layer and the second composition gradient layer are formed such that bandgap energy of each of the layers is monotonically decreased from the current confinement layer to an adjacent layer and approach bandgap energy of the adjacent layer in a growth direction, the second-conductivity-type cladding layer includes material for reducing mobility of carrier, and carrier concentration of the second composition gradient layer is equal to or more than four times that of the carrier concentration of the current injection portion of the current confinement layer, the carrier concentration of the second composition gradient layer is equal to or more than $4\times10^{18}$ cm$^{-3}$ and equal to or less than $2\times10^{20}$ cm$^{-3}$, and layers from the first-conductivity-type contact layer to the second-conductivity-type contact layer except for the active layer are formed of a material chosen from AlGaAs-based, GaInAs-based, AlGaInAs-based, and InP-based semiconductor materials.

* * * * *